(12) United States Patent
Tachikawa et al.

(10) Patent No.: US 11,726,143 B2
(45) Date of Patent: *Aug. 15, 2023

(54) TERMINAL APPARATUS FOR BATTERY MODULE ASSEMBLY

(71) Applicant: Honda Motor Co., Ltd., Tokyo (JP)

(72) Inventors: Kosuke Tachikawa, Wako (JP); Atsushi Nakano, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 95 days.

This patent is subject to a terminal disclaimer.

(21) Appl. No.: 17/223,216

(22) Filed: Apr. 6, 2021

(65) Prior Publication Data

US 2021/0318385 A1 Oct. 14, 2021

(30) Foreign Application Priority Data

Apr. 8, 2020 (JP) ................. 2020-069921

(51) Int. Cl.
*G01R 31/00* (2006.01)
*G01R 31/382* (2019.01)
*H01M 10/42* (2006.01)
*H01M 10/48* (2006.01)

(52) U.S. Cl.
CPC ........ *G01R 31/382* (2019.01); *H01M 10/425* (2013.01); *H01M 10/482* (2013.01); *H01M 2010/4271* (2013.01)

(58) Field of Classification Search
USPC .................................. 324/426, 435
See application file for complete search history.

(56) References Cited

U.S. PATENT DOCUMENTS

| 10,763,680 | B2 * | 9/2020 | Toya ................ H02J 7/0063 |
| 2016/0359343 | A1 * | 12/2016 | Ito .................... H02J 7/0029 |
| 2018/0097263 | A1 * | 4/2018 | Shoji ................ H01M 50/517 |

FOREIGN PATENT DOCUMENTS

JP        2013140055 A        7/2013

* cited by examiner

*Primary Examiner* — Vincent Q Nguyen
(74) *Attorney, Agent, or Firm* — Duft & Bornsen, PC

(57) ABSTRACT

A terminal apparatus detachably mounted on a battery module assembly made up of module units which are formed as aggregates of a plurality of cells and accommodated in a battery case through its open end. The apparatus has a computer which is programed to acquire state of the battery module assembly, to communicate acquired state of the battery module assembly to outside, and to connect or disconnect output of the battery module assembly to or from a load such as a vehicle electric motor, a factory electrical machine tool, home lighting fixtures and a construction machine electric motor by means of switch. The computer is further programed to detect change of the load and to switch output of the battery module assembly in accordance with changed load when the change of the load is detected.

6 Claims, 4 Drawing Sheets

TERMINAL APPARATUS FOR BATTERY MODULE ASSEMBLY

CROSS-REFERENCE TO RELATED APPLICATIONS

This invention is based upon and claims the benefit of priority from Japanese Patent Application No. 2020-069921 filed on Apr. 8, 2020, the contents of which are incorporated herein by reference.

BACKGROUND OF THE INVENTION

Field of the Invention

This invention relates to a terminal apparatus for battery module assembly.

The spread of electric vehicles has led to wide use of onboard battery module assemblies comprised of unit modules accommodated in a battery case. After a battery module assembly of this type has served its initial purpose, it can be diverted to another purpose, i.e., it can be applied to a secondary use. However, an onboard battery module assembly of this type is usually optimized for a dedicated vehicle type so that diversion to another use cannot be directly achieved simply by dismounting/mounting steps but also requires use of a battery control unit or the like.

As a response to this situation, Japanese Unexamined Patent Publication No. 2013-140055 (JP2013-140055A) teaches a technology for managing battery module degradation data. The configuration according to the technology of the reference comprises a sensor unit that detects data of individual module units and a battery monitor unit that wirelessly receives such data and sequentially acquires degradation data of individual module units.

A point of interest here is that since output power of a battery module assembly is high owing to its accommodation of multiple module units, care is required to ensure safe storage and transport of the battery module assembly. The technology of the reference does not propose a solution regarding this point.

SUMMARY OF THE INVENTION

The object of this invention is therefore to overcome the aforesaid problem by providing a terminal apparatus for battery module assembly that enables safe storage and transport of a battery module assembly accommodating unit modules.

In order to achieve the object, this invention provides a terminal apparatus of a battery module assembly, comprising: a state acquisition unit that acquires state of the battery module assembly; a communication unit that communicates state of the battery module assembly acquired by the state acquisition unit to outside; a connect/disconnect unit that connects or disconnects output of the battery module assembly to or from a load; a load change detection unit that detects change of the load; and an output switching unit that switches output of the battery module assembly in accordance with changed load when the change of the load is detected by the load change detection unit.

BRIEF DESCRIPTION OF THE DRAWINGS

The above and other objects and advantages will be more apparent from the following description and drawings, in which.

DETAILED DESCRIPTION OF THE INVENTION

In the following, the terminal apparatus for battery module assembly according to an embodiment of this invention is explained with reference to the attached drawings.

Figure 1:
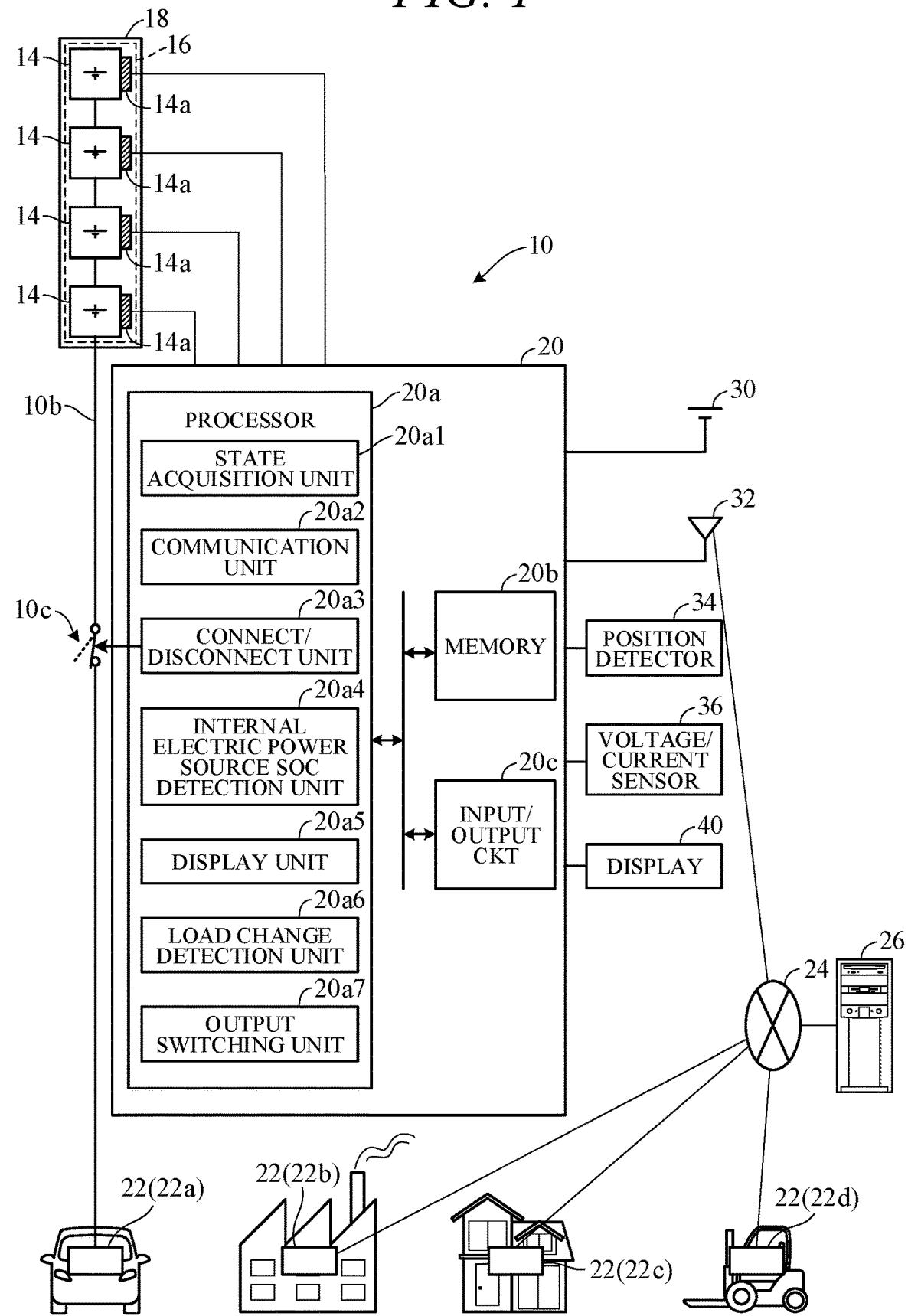
FIG. 1 is a conceptual diagram of a terminal apparatus for battery module assembly according to an embodiment of this invention.

FIG. 1 is a conceptual diagram of a terminal apparatus for battery module assembly according to an embodiment of this invention. FIGS. 2 and 3 are explanatory views for explaining the battery module assembly shown in FIG. 1. FIG. 4 is an explanatory view detailing operation of the terminal apparatus for battery module assembly shown in FIG. 1, more specifically, detailing configuration a computer incorporated in the terminal apparatus.

Figure 2A:
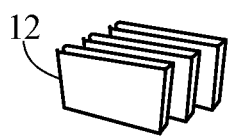
FIGS. 2A to 2C are explanatory views for explaining the battery module assembly shown in FIG. 1.
Figure 2B:
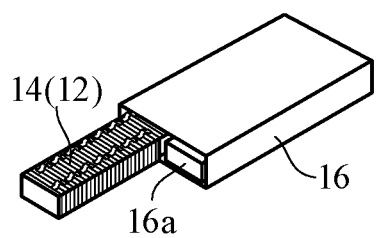
Figure 2C:
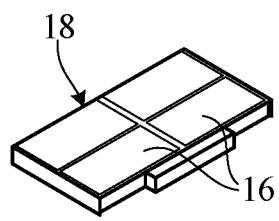

Reference numeral 10 in FIG. 1 designates a terminal apparatus for battery module assembly. The terminal apparatus 10 is adapted for easy-detachable mounting on a battery module assembly 18 that, as shown in FIG. 2C, is formed of battery cases 16 packed (modularized) as shown in FIGS. 2A and 2B to accommodate multiple (four in the illustrated embodiment) module units 14 formed of assemblies (laminates) obtained by assembling (laminating) cells (battery cells) 12 capable of storing electric power. Suitable insulation is applied between the cells 12 and the battery case 16.

Figure 3A:
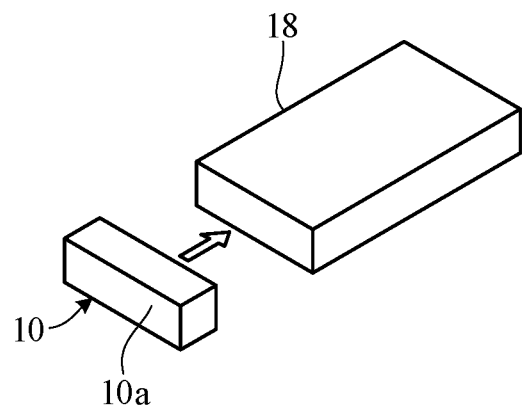
FIGS. 3A and 3B are explanatory views for explaining the battery module assembly shown in FIG. 1.
Figure 4:
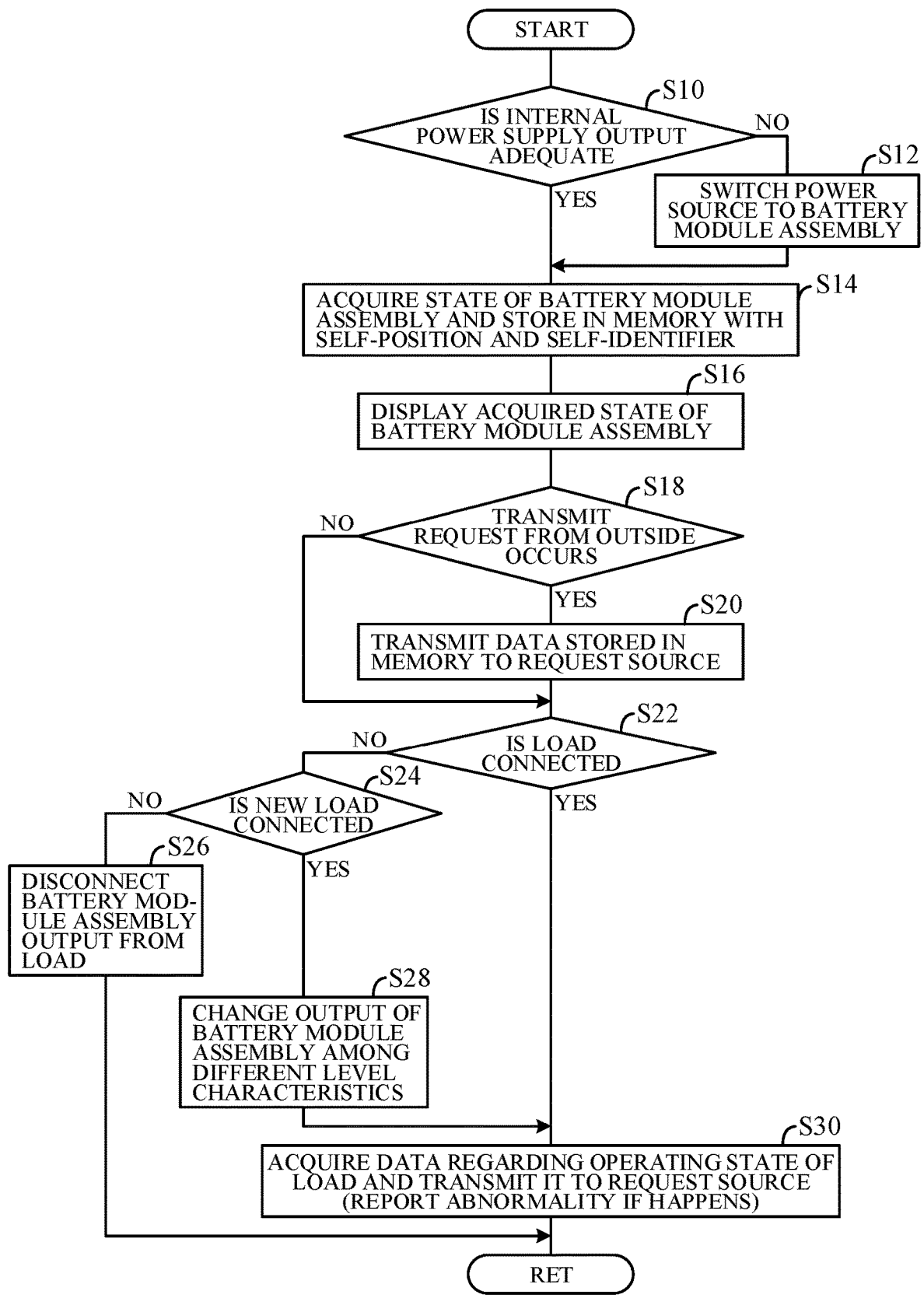
FIG. 4 is an explanatory view detailing operation of the terminal apparatus for battery module assembly shown in FIG. 1.

As shown in FIG. 3A, the terminal apparatus 10 is detachably mounted on the battery module assembly 18. Although the number of module units 14 per battery module assembly 18 is four in the illustrated example, it can optionally be only one or greater than four.

Figure 3B:
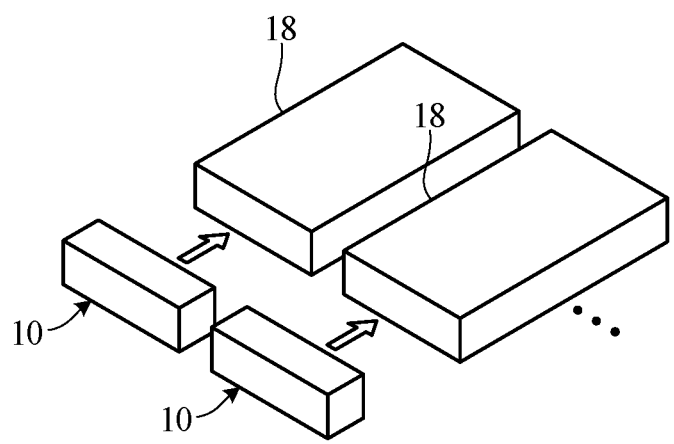

The battery case 16, which is a bottomed rectangular box with an open end 16a, is fabricated by extrusion molding a material such as aluminum. As best shown in FIG. 3A, the terminal apparatus 10 has a rectangular box-like case 10a formed of similar material. Once the module units 14 formed as assemblies of cells 12 have been accommodated in the battery case 16 by insertion through the open end 16a, the terminal apparatus 10 is detachably mounted on the battery case 16 so as to close the open end 16a and be easily detachable therefrom, i.e., the battery module assembly 18 is accommodated in the battery case 16 when the open end 16a of the battery case 16 is closed. Optionally, as shown in FIG. 3B, multiple terminal apparatuses 10 (and battery module assemblies 18) can be connected.

The terminal apparatus 10 is equipped with a computer 20. The computer 20 is housed in the case 10a. As shown in FIG. 1, it comprises a processor 20a, a memory 20b and an input/output circuit 20c. The computer 20 is configured to be capable of receiving and transmitting general-purpose signals through a connector (not shown) provided in the case 10a.

As shown at the bottom of FIG. 1, output of the battery module assembly 18 is applied through an output terminal 10b to a load 22. However, a switch 10c is provided for making and breaking connection between the output terminal 10b and the load 22.

The load 22 is, for example, an electrical load 22a from a vehicle electric motor or the like, an electrical load 22b from an electrical machine tool or the like at a factory, an electrical load 22c from lighting fixtures and the like at a residence or an electrical load 22d from a construction machine electric motor or the like. When the battery module assembly 18 is connected to one of these as an operating electric power source, it outputs (discharges) power in accordance with associated power demand. Moreover, when the load 22 is an electric motor of a vehicle or the like, the battery module assembly 18 receives regenerative power input (is charged) through a PDU (Power Drive Unit, not shown) during regeneration. Each of the loads 22 is equipped with a control computer similar to that of the terminal apparatus 10.

The computer 20 of the terminal apparatus 10 is connected via an antenna 32 and a network 24 or through a connector (not shown) or other means so as to be capable of accessing outside units (control computers of the loads 22 or a server computer 26) and is configured to be capable of access via Wi-Fi or other general purpose communication path or via a TCU (Telematics Control Unit) or other exclusive (dedicated) line. The network 24 is one that enables wireless or wired transmission-reception of data between the terminal apparatus 10 and the control devices of the loads 22 and can comprise of, among other examples, the Internet or a LAN, public telephone communication network, company-internal network, or service provider network.

The server computer 26 is a relatively high-performance computer, such as a mainframe, installed at a suitable location, such as at an office of the module unit 14 supplier. Alternatively, the server computer 26 can be a cloud computer.

The loads 22 are each equipped with a control computer similar to that of the aforesaid terminal apparatus 10 and most of the loads 22 are additionally individually equipped with onboard control devices (electronic control devices) for controlling their operation. The control devices are computers equipped with processors, memories and input/output circuits, and are configured so that when the terminal apparatus 10 (battery module assembly 18) is connected, they can communicate with the terminal apparatus 10 via antenna or cable so as to enable the terminal apparatus 10 to acquire data regarding operating state and the like of the loads 22.

The module units 14 of the battery module assembly 18 are each equipped with a BMS 14a (Battery Management System) that detects and sends to the computer 20 state-of-charge (SOC) value of the associated module unit 14. The computer 20 is equipped with an internal power supply 30, an antenna 32 enabling wireless outside transmission-reception, a position detector 34 constituted of a GPS signal receiver that detects location of the terminal apparatus 10 (i.e., the battery module assembly 18), a voltage/current sensor 36 installed near the output terminal 10b that detects voltage and current of electric power supplied to the loads 22, and a display 40.

As shown in FIG. 1, the processor 20a of the computer 20 installed in the terminal apparatus 10 comprises a state acquisition unit 20a1 that acquires state of the module units 14, a communication unit 20a2 that communicates general purpose signals to/from outside via a connector or the like provided in the case 10a and that communicates state of the module units 14 acquired by the state acquisition unit 20a1 to outside, a connect/disconnect unit 20a3 that connects or disconnects the battery module assembly 18 to or from the load 22, an internal electric power source SOC detection unit 20a4 that detects SOC of the internal power supply 30 provided independently of the battery module assembly 18, a display unit 20a5 that displays at least SOC value of the battery module assembly 18 acquired by the state acquisition unit 20a1, a load change detection unit 20a6 that detects change of the load 22, and an output switching unit 20a7 responsive to detection of change of load 22 by the load change detection unit 20a6 that switches output of the battery module assembly 18 in accordance with changed load. Specifically, a configuration is adopted whereby the processor 20a of the computer 20 performs the aforesaid functions by executing a program stored in the memory 20b. The switch 10c is provided in the vicinity of the output terminal 10b in association with the connect/disconnect unit 20a3. The display 40 is used for display by the display unit 20a5.

FIG. 4 is a flowchart showing operation of the terminal apparatus 10 of the battery module assembly 18, specifically the aforesaid functions performed by the processor 20a of the computer 20.

Now to explain, in S10 (S: processing Step), it is determined whether output of the internal power supply 30 is adequate as operating power of the computer 20. The internal power supply 30 is, for example, a button battery detachably attached at a suitable location on the case 10a of the terminal apparatus 10 incorporating the computer 20.

When the result in S10 is NO, the program goes to S12, in which the computer 20 operating power source is switched to the battery module assembly 18. Next in S14, SOC of the individual module units 14 is detected from output of the BMSes 14a and the so-acquired (ascertained) state of the battery module assembly 18 is stored at an appropriate address of the memory 20b together with self-position acquired from the position detector 34 and a self-identifier assigned in advance. When the result in S10 is YES, the processing of S12 is skipped.

Next, in S16, state of the battery module assembly 18 acquired in S14 is displayed on the display 40. Optionally, either or both of self-position and self-identifier can be simultaneously displayed. The display 40, which can be of any type insofar as capable of displaying state of the battery module assembly 18, is not limited to a liquid crystal panel that accurately displays state of the module units 14 in characters but can instead be one that indicates the state synoptically using colors or patterns.

Next, in S18, it is determined occurrence or not of a transmit request from outside (e.g., from control computer of load 22 or server computer 26). When the result is YES, the program goes to S20, in which data stored in memory in S14 is transmitted (communicated) to the request source through the antenna 32 and network 24. When the result in S18 is NO, the processing of S20 is skipped.

Next, in S22, it is determined whether the load 22 concerned is connected. This is determined from data acquired in S14 and change of output of the voltage/current sensor 36.

When the result in S22 is NO, the program goes to S24, in which it is determined whether a new load (hereinafter called "second load") 22 is connected (i.e., whether load 22 was changed), and when the result is NO, the program goes to S26, in which the output terminal 10b of the battery module assembly is disconnected from the load 22 concerned by means of the switch 10c. In this context, "change of load 22" means, for example, change from load 22a to load 22b.

When, to the contrary, the result in S24 is YES, the program goes to S28, in which output of the battery module assembly 18 is changed among different level characteristics in accordance with power (output) required by the second load 22. That is, the output switching unit 20a7 stores multiple different level characteristics and responds to detection by the load change detection unit 20a6 that load 22 was changed and switches output of the battery module assembly 18 among multiple stored characteristics in accordance with the changed load 22. At this time the output switching unit 20a7 also controls output of the battery module assembly 18 based on instruction from the communication unit 20a2.

On the other hand, when the result in S22 is YES, the program goes to S30. When the result in S22 is NO and in S28 is YES, it also goes to S30. In S30, data regarding operating state and the like of the load 22 are acquired and the acquired load 22 operating state and other data are transmitted to outside the request source (e.g., to the currently connected terminal apparatus 10, control apparatus of another load 22, or the server computer 26). That is, as mentioned earlier, the control apparatus which controls operation of the load (or second load) 22 is accessed to ascertain operating state and the like of the load 22. These operations are performed by the communication unit 20a2.

In actual operation, the communication unit 20a2 wirelessly accesses the control apparatus of the load 22 (via the antenna 32). Moreover, a configuration is adopted whereby, when, as shown in FIG. 3B, multiple terminal apparatuses 10 are connected to the load 22 at this time, only at least one among the multiple communication units 20a2 operates.

At this time, the communication unit 20a2 also monitors or estimates operating state of the load 22 using data acquired from the load 22. When the communication unit 20a2 ascertains happening of abnormal operation, it reports the same to the outside. Such reports are preferably sent out over an exclusive or dedicated line rather than via Wi-Fi or other general purpose communication path.

The processor 20a of the computer 20 repeatedly performs the processing of the flowchart of FIG. 4 at predetermined time intervals.

As described in the foregoing, this embodiment is configured to have a terminal apparatus (10) of a battery module assembly (18), comprising: a state acquisition unit (20a1 of processor 20a of computer 20; S14) that acquires state of the battery module assembly (18); a communication unit (20a2 of processor 20a of computer 20; S18, S20) that communicates state of the battery module assembly (18) acquired by the state acquisition unit to outside; and a connect/disconnect unit (20a3 of processor 20a of computer 20; S22 to S28) that connects or disconnects output of the battery module assembly (18) to or from a load (22) (by means of switch 10c). With this, it enables output of the battery module assembly 18 to be disconnected from the load 22 by means of the connect/disconnect unit 20a3, thereby enabling the battery module assembly 18 to be removed from the load 22 for safe storage or transport. Moreover, since the load 22 is at least one among, for example, a vehicle electric motor, a factory electrical machine tool, home lighting fixtures and a construction machine electric motor, the battery module assembly 18 can be removed from such load 22 and safely stored or transported.

Moreover, it further includes a battery case (16) having an open end (16a), the battery module assembly (18) comprises module units (14) which are formed as aggregates of a plurality of cells (12) and accommodated in the battery case (16) through the open end (16a) of the battery case (16) when the open end (16a) of the battery case (16) is closed. With this, since the terminal apparatus 10 is detachably attached so as to close the open end 16a, structural simplification and reduction of number of terminal apparatuses 10 components can be realized in addition to the foregoing effects.

It includes a position detector (34) that detects location of the battery module assembly (18), and the state acquisition unit is configured to acquire SOC of the battery module assembly (18) and location thereof detected by the position detector (34). With this, in addition to the aforesaid effects, location of the battery module assembly 18 can be easily ascertained even when in a state disconnected from the load 22.

It includes an internal power supply (30) provided independently of the battery module assembly (18) and an internal electric power source SOC detection unit (20a4 of processor 20a of computer 20; S10) that detects SOC of the internal power supply (30), wherein when the internal electric power source SOC detection unit detects that remaining battery charge of the internal power supply (30) is exhausted (S12), supply of power is received from the battery module assembly (18). With this, in addition to the aforesaid effects, wherever it locates necessary power can be received from the internal power supply 30 and even when the remaining internal power supply 30 is exhausted, it can be received the necessary power from the battery module assembly 18 without fail.

Moreover, the internal power supply (30) is configured to be detachably attached. With this, in addition to the aforesaid effects, the internal power supply 30 can be easily detached when not needed.

Furthermore, it further includes a display unit (20a5 of processor 20a of computer 20; S16) that displays at least SOC of the battery module assembly (18) acquired by the state acquisition unit on the display (40). With this, state of the battery module assembly 18 can be easily ascertained simply by attaching the terminal apparatus 10 to the battery module assembly 18.

As described in the foregoing, this embodiment is configured to have a terminal apparatus (10) of a battery module assembly (18), comprising: a state acquisition unit (20a1 of processor 20a of computer 20; S14) that acquires state of the battery module assembly (18); a communication unit (20a2 of processor 20a of computer 20; S18, S20) that communicates state of the battery module assembly (18) acquired by the state acquisition unit to outside; a connect/disconnect unit (20a3 of processor 20a of computer 20; S22 to S28) that connects or disconnects output of the battery module assembly (18) to or from a load (22) (by means of switch 10c); and a load change detection unit (20a6 of processor 20a of computer 20; S22, S24) that detects change of the load (22); and an output switching unit (20a7 of processor 20a of computer 20; S28) that switches output of the battery module assembly (18) in accordance with changed load when the change of the load is detected by the load change detection unit. With this, it enables output of the battery module assembly 18 to be disconnected from the load 22 by means of the connect/disconnect unit 20a3, thereby enabling the battery module assembly 18 to be removed from the load 22 for safe storage or transport and further enabling power to be optimally supplied in accordance with load even when load 22 is changed.

Moreover, it further includes a battery case (16) having an open end (16a), the battery module assembly (18) comprises module units (14) which are formed as aggregates of a plurality of cells (12) and accommodated in the battery case (16) through the open end (16a) of the battery case (16)

when the open end (16a) of the battery case (16) is closed. With this, since the terminal apparatus 10 is detachably attached so as to close the open end 16a, structural simplification and reduction of number of terminal apparatuses 10 components can be realized in addition to the foregoing effects.

The output switching unit (20a7) is configured to control output of the battery module assembly (18) based on instruction from the communication unit (20a2). With this, in addition to the aforesaid effects, the battery module assembly 18 can be optimally utilized with respect to the load 22 concerned, e.g., with respect to the electrical vehicle equipment load 22a.

It is configured such that the output switching unit (20a7) stores multiple characteristics and when it is detected by the load change detection unit that load (22) was changed, switches output of the battery module assembly among multiple stored characteristics in accordance with the changed load (22) (S28). With this, in addition to the aforesaid effects, supply of power to the load 22 can be optimized.

Moreover, it is configured such that the communication unit (20a2) acquires operating state of a second load (22) based on state of the battery module assembly (18) acquired by the state acquisition unit and communicates the acquired operating state to outside (S30). With this, in addition to the aforesaid effects, supply of power to the load 22 can be additionally optimized.

As described in the foregoing, this embodiment is configured to have a terminal apparatus (10) of a battery module assembly (18), comprising: a state acquisition unit (20a1 of processor 20a of computer 20; S14) that acquires state of the battery module assembly (18); a communication unit (20a2 of processor 20a of computer 20; S18, S20) that communicates state of the battery module assembly (18) acquired by the state acquisition unit to outside; and a connect/disconnect unit (20a3 of processor 20a of computer 20; S22 to S28) that connects or disconnects output of the battery module assembly (18) to or from a load (22) (by means of switch 10c); wherein the communication unit (20a3) communicates with a control apparatus which controls operation of the load connected, acquires data of the load and communicates the acquired data of the load to outside (S30). With this, by disconnecting output of the battery module assembly 18 from the load 22, the battery module assembly 18 can be removed from the load 22 for safe storage or transport, and data regarding operating state and the like of the load 22 can be acquired and transmitted to outside, whereby connection of the battery module assembly 18 equipped with the terminal apparatus 10 imparts the load 22 with communication capability even when the load 22 itself does not have external communication capability.

The communication unit (20a2) is configured to have wireless external communication capability (via the antenna 32). With this, in addition to the aforesaid effects, data regarding operating state and the like of the connected load 22 can be easily and promptly acquired and communicated to outside.

It is configured such that when multiple terminal apparatuses (10) are connected to the same load (22), only at least one among the multiple communication units (20a2) operates. With this, that structural simplification can be achieved in addition to the aforesaid effects.

It is configured such that the communication unit (20a2) monitors or estimates operating state of the load (22) based on the acquired load data (S30). With this, in addition to the aforesaid effects, operating state of the connected load 22 can be suitably ascertained.

It is configured such that when the communication unit (20a2) determines from the acquired load data that operating state of the load (22) is abnormal, it reports it to the outside (S30). With this, it enables the control apparatus or the like of the load 22 concerned to implement necessary measures.

It further includes a battery case (16) having an open end (16a), the battery module assembly (18) comprises module units (14) which are formed as aggregates of a plurality of cells (12) and accommodated in the battery case (16) through the open end (16a) of the battery case (16) when the open end (16a) of the battery case (16) is closed. With this, since the terminal apparatus 10 is detachably attached so as to close the open end 16a, structural simplification and reduction of number of terminal apparatuses 10 components can be realized in addition to the foregoing effects.

While the present invention has been described with reference to the preferred embodiments thereof, it will be understood, by those skilled in the art, that various changes and modifications may be made without departing from the scope of the appended claims.

What is claimed is:

1. A terminal apparatus adapted for detachable mounting on a battery module assembly, comprising:
   a state acquisition unit that acquires a state of the battery module assembly;
   a communication unit that communicates the state of the battery module assembly to outside;
   a connect/disconnect unit that connects or disconnects output of the battery module assembly to or from a load;
   a load change detection unit that detects a change of the load;
   an output switching unit that switches the output of the battery module assembly in accordance with the change of the load when the change of the load is detected by the load change detection unit; and
   a battery case having an open end, wherein
   the battery module assembly comprises a plurality of cells and is accommodated in the battery case,
   the plurality of cells are inserted into the battery case through the open end, and
   the terminal apparatus is attached for detachable mounting on the battery module assembly so as to close the open end.

2. The terminal apparatus according to claim 1, wherein the communication unit is configured to acquire data regarding the load, and
   the output switching unit is configured to control the output of the battery module assembly based on instruction from the communication unit.

3. The terminal apparatus according to claim 1, wherein the output switching unit stores multiple different level characteristics in accordance with the output of the battery module assembly and when it is detected by the load change detection unit that the load was changed, switches the output of the battery module assembly among the multiple different level characteristics in accordance with the change of the load.

4. The terminal apparatus according to claim 1, wherein the communication unit acquires an operating state of the load based on the state of the battery module and communicates the operating state to the outside.

5. The terminal apparatus according to claim 1, wherein the load is at least one among a vehicle electric motor, a factory electrical machine tool, home lighting fixtures and a construction machine electric motor.

6. A terminal apparatus adapted for detachable mounting on a battery module assembly, comprising:
- a battery case having an open end, and
- a computer equipped with at least one processor and at least one memory coupled to the processor,
- wherein the processor is configured to perform as
  - a state acquisition unit that acquires a state of the battery module assembly;
  - a communication unit that communicates the state of the battery module assembly to outside;
  - a connect/disconnect unit that connects or disconnects output of the battery module assembly to or from a load;
  - a load change detection unit that detects a change of the load; and
  - an output switching unit that switches the output of the battery module assembly in accordance with the change of the load when the change of the load is detected by the load change detection unit,
- the battery module assembly comprises a plurality of cells and is accommodated in the battery case,
- the plurality of cells are inserted into the battery case through the open end, and
- the terminal apparatus is attached for detachable mounting on the battery module assembly so as to close the open end.

* * * * *